US006250935B1

(12) United States Patent
Mochizuki et al.

(10) Patent No.: US 6,250,935 B1
(45) Date of Patent: Jun. 26, 2001

(54) ELECTRICAL CONNECTOR

(75) Inventors: Shoichi Mochizuki, Yamanasi; Yasuhiro Ono, Kanagawa, both of (JP)

(73) Assignee: Kel Corporation, Tokyo (JP)

( * ) Notice: Subject to any disclaimer, the term of this patent is extended or adjusted under 35 U.S.C. 154(b) by 0 days.

(21) Appl. No.: 09/299,343

(22) Filed: Apr. 26, 1999

(30) Foreign Application Priority Data

May 6, 1998 (JP) ........................................ 10-123328

(51) Int. Cl.$^{7}$ .............................. H01R 12/00; H05K 1/00
(52) U.S. Cl. ............................ 439/74; 439/108; 439/608
(58) Field of Search ............................ 439/74, 607, 608, 439/108, 660

(56) References Cited

U.S. PATENT DOCUMENTS 5,813,871 * 9/1998 Grabbe et al. ....................... 439/108
5,915,976 * 6/1999 McHugh ................................ 439/74

FOREIGN PATENT DOCUMENTS

WO 98/09354 * 3/1998 (WO) .

* cited by examiner

*Primary Examiner*—Michael L. Gellner
*Assistant Examiner*—Kyung S. Lee
(74) *Attorney, Agent, or Firm*—Robert W. J. Usher

(57) ABSTRACT

A plug connector 10 includes a central grounding plate 13, which is provided between two lateral rows of signal plug contacts 12*a*. In these rows, grounding plug contacts 12*b* are positioned to partition the signal plug contacts 12*a* and to establish electrical contact with the central grounding plate 13. A receptacle connector 30 includes a pair of lateral grounding plates 33, which are positioned outside two lateral rows of signal receptacle contacts 32*a*. Grounding receptacle contacts 32*b* are provided at locations which correspond with the locations of the grounding plug contacts 12*b* and are in electrical connection to the lateral grounding plates 33. This electrical connector assembly has a relatively small number of parts yet prevents crosstalk and reflection of signals effectively.

5 Claims, 4 Drawing Sheets

ELECTRICAL CONNECTOR

FIELD OF THE INVENTION

The present invention generally relates to an electrical connector assembly for signal transmission which has two intermatable, plug and receptacle connector halves, and more particularly to an electrical connector for high-speed signal transmission which has a plurality of electrical contacts aligned in rows with a relatively small pitch.

BACKGROUND OF THE INVENTION

An electrical connector assembly which is designed with intermatable connector halves for high- speed signal transmission is well known in the art. In this type of electrical connector, a plug connector half is designed with a plurality of plug contacts which are aligned on a convex feature provided in a housing while a receptacle connector half is designed with a plurality of receptacle contacts which are aligned on a concave feature provided in another housing. These plug and receptacle connectors are electrically connected to enable signal transmission when their respective housings are mated by inserting the convex portion of the plug connector into the concave portion of the receptacle connector and thereby the interconnecting corresponding pairs of plug and receptacle contacts. In this type of high-speed signal transmission connector, these electrical contacts are usually positioned with a relatively small pitch in the respective housings, so signal leak (i.e., crosstalk) between adjacent contacts is likely to happen. In addition, if there is a mismatch of impedance, then signal reflection is likely to occur. To prevent such problems, various methods are proposed.

One method is to provide a grounding plate in parallel with the rows of plug contacts which are aligned on opposites sides of the convex portion of the plug connector or in parallel with the rows of receptacle contacts which are aligned in the housing of the receptacle connector and to connect this grounding plate to a grounding pathway provided on a printed circuit board by using a special part.

However, in this method, the special part is designed especially for this grounding connection, so the provision of this special part increases the number of parts necessary for the production of the electrical connector, which is disadvantageous in reducing production cost. Beside this disadvantage, the existence of this special part, which is used solely for the electrical grounding of the electrical connector, creates an unwanted impedance characteristic. Moreover, a relatively long electrical pathway is required for connecting this special grounding part, which is provided in the electrical connector, to a grounding pathway which is provided on the printed circuit board. This long electrical pathway is a hindrance to any attempt which can be effected to improve the impedance characteristic of the electrical connector.

SUMMARY OF THE INVENTION

It is an object of the present invention to provide an electrical connector which has an improved impedance characteristic without increasing the number of parts used.

The scope of the present invention includes not only an independent plug connector and an independent receptacle connector but also a set of a plug connector and a receptacle connector which are intermatable.

A plug connector according to the present invention comprises a plug housing, a plurality of signal plug contacts and a first grounding plate (e.g., the central grounding plate 13 of the embodiment described in the following section of this document). The plug housing includes a plug cavity, which opens in the direction for engagement with an intermatable receptacle connector. The signal plug contacts are aligned in lateral pairs, i.e., in two rows, in the plug cavity, these rows extending in the back-and-forth direction of the plug connector (an arbitrary direction which is defined in the following section for the purpose of description only). The first grounding plate extends between the lateral two rows of signal plug contacts also in the back-and-forth direction. In addition, the plug connector further includes a plurality of grounding plug contacts, which are provided substantially orthogonally to the first grounding plate, for partitioning the rows of signal plug contacts. The grounding plug contacts are in contact and electrical connection with the first grounding plate.

Preferably, the plug housing comprises lateral side walls, a base wall and a protrusion. The lateral side walls and the base wall define the plug cavity, and the protrusion protrudes from the base wall into the plug cavity, extending in the back-and-forth direction. Furthermore, each of the signal plug contacts and grounding plug contacts comprises a plug base portion (e.g., the base portion 15 of the following embodiment), which extends laterally, and a plug contact portion (e.g., the contact portion 16 of the following embodiment which extends from the plug base portion to the opening of the plug cavity. The signal plug contacts and grounding plug contacts are mounted in the plug housing with the plug contact portions extending along the lateral side faces of the protrusion and the plug base portions extending along the base wall laterally outward. Moreover, the first grounding plate is positioned inside the protrusion of the plug housing, extending in the back-and-forth direction, and the portions of the first grounding plate which are exposed from the protrusion of the plug housing are set in contact with the central portions of the grounding plug contacts. Furthermore, plug lead portions (e.g., the lead portions 18 of the following embodiment) are provided as extensions to the plug base portions of the signal plug contacts and grounding plug contacts, and the plug lead portions are exposed to outside from the base wall. These lead portions are used for surface mounting the plug connector onto a circuit provided on a printed circuit board which is designed for the plug connector.

With this construction, the possibility of crosstalk which may be observable between the lateral pairs of signal plug contacts is very small, so the signal transmission characteristic of the connector is kept in good condition. In this construction, a plurality of grounding plug contacts are provided to partition the signal plug contacts into groups, so a plurality of electrically grounding pathways can be also provided in the circuit of the printed circuit board, to establish a plurality of grounding connections to the first grounding plate in substantially short distance. Thereby, the possibility of crosstalk is further reduced, and improvement can be made in the impedance characteristic or high-frequency characteristics of the connector.

In addition, because the grounding plug contacts are provided as parts of the electrical contacts which are placed in the plug housing, there is no need of providing separate parts such as special contacts used in the prior art, for the connection of the grounding plate to the grounding pathways, which are provided on the printed circuit board. Therefore, the electrical connector according to the present invention requires a relatively small number of parts, so it can avoid unfavorable impedance characteristic, which may be otherwise generated by adding such separate parts.

Furthermore, a receptacle connector according to the present invention comprises a receptacle housing, a plurality of signal receptacle contacts and a lateral pair of second grounding plates (e.g., the lateral grounding plates 33 of the following embodiment). The receptacle housing includes a receptacle cavity, which is open in the direction for engagement with the plug connector. The signal receptacle contacts are aligned in lateral pairs, i.e., in two rows, in the receptacle cavity, and these rows extend in the back-and-forth direction. The second grounding plates extend also in the back-and-forth direction but outside the lateral two rows of signal receptacle contacts. In addition, the receptacle connector further comprises a plurality of grounding receptacle contacts, which partition the rows of signal receptacle contacts into groups. The grounding receptacle contacts are positioned in the receptacle housing substantially orthogonally to the second grounding plates, at the locations which correspond with those of the grounding plug contacts in the plug connector, and the grounding receptacle contacts are in contact and electrical connection with the second grounding plates.

Preferably, the receptacle housing comprises lateral side walls and a base wall, which define the receptacle cavity. Furthermore, each of the signal receptacle contacts and grounding receptacle contacts comprises a receptacle base portion (e.g., the base portion 35 of the following embodiment), which extends laterally, and a receptacle contact portion (e.g., the contact portion 36 of the following embodiment), which extends from the receptacle base portion to the opening of the receptacle cavity. The signal receptacle contacts and the grounding receptacle contacts are mounted in the receptacle housing with the receptacle contact portions extending along inside faces of the lateral side walls and the receptacle base portions extending along the base wall laterally outward. In addition, the second grounding plates are provided outside the lateral side walls of the receptacle housing, each grounding plate on one lateral side wall. Moreover, receptacle lead portions (e.g., the lead portions 38 of the following embodiment) which are extensions of the receptacle base portions of the signal receptacle contacts and grounding receptacle contacts are exposed to outside from the base wall. These lead portions are surface mounted onto a circuit which is provided on a printed circuit board for the receptacle connector. In this construction, each of the grounding receptacle contacts may be formed in lateral symmetry in a one-piece body rather than separate, right and left halves. In this way, electrical noise coming from the outside environment is blocked as effectively as crosstalk is eliminated as described above.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only and thus are not limitative of the present invention and wherein.

DESCRIPTION OF THE PREFERRED EMBODIMENTS

Figure 1:
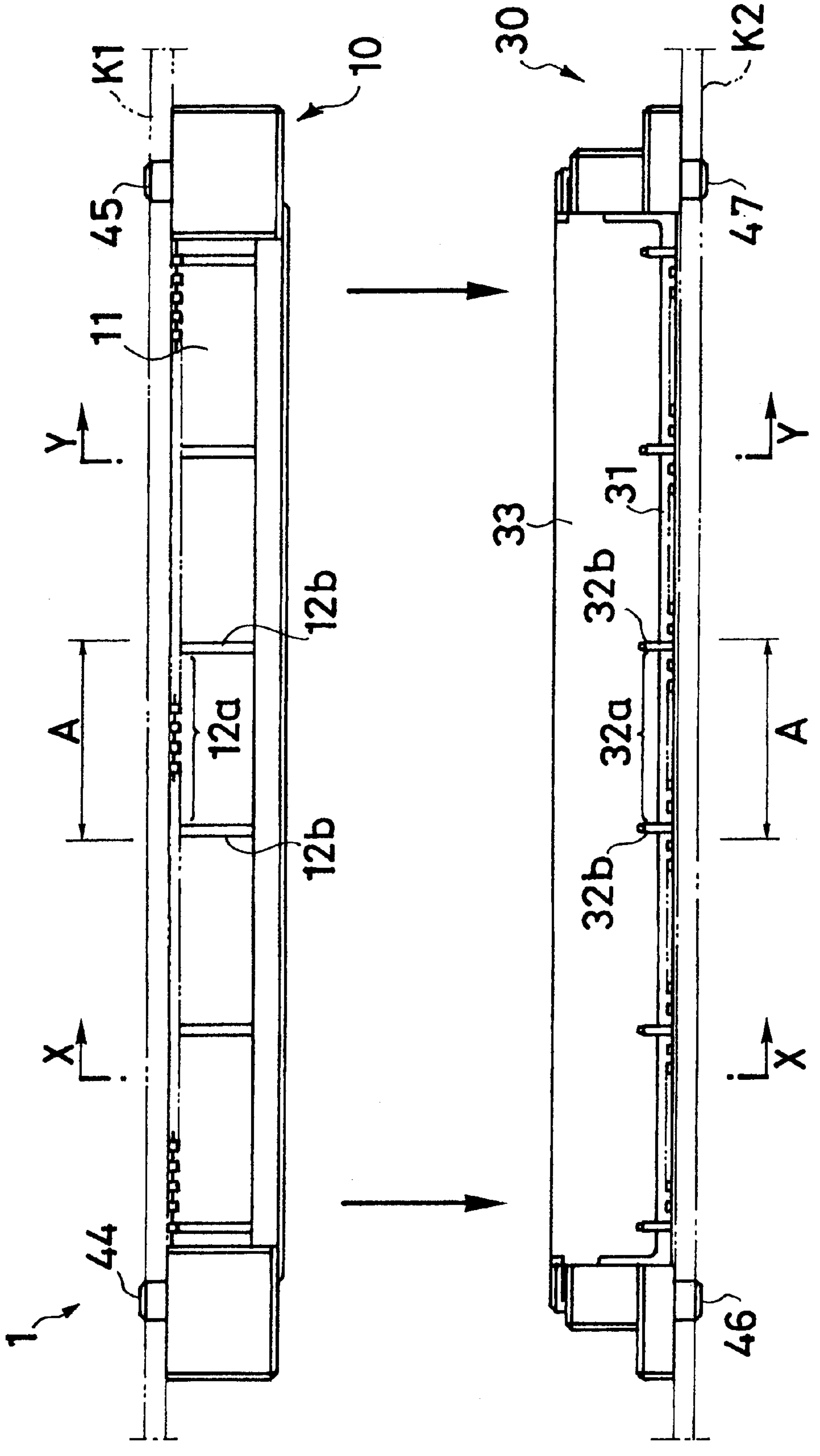
FIG. 1 shows a side view of an electrical connector assembly according to the present invention.
Figure 2:
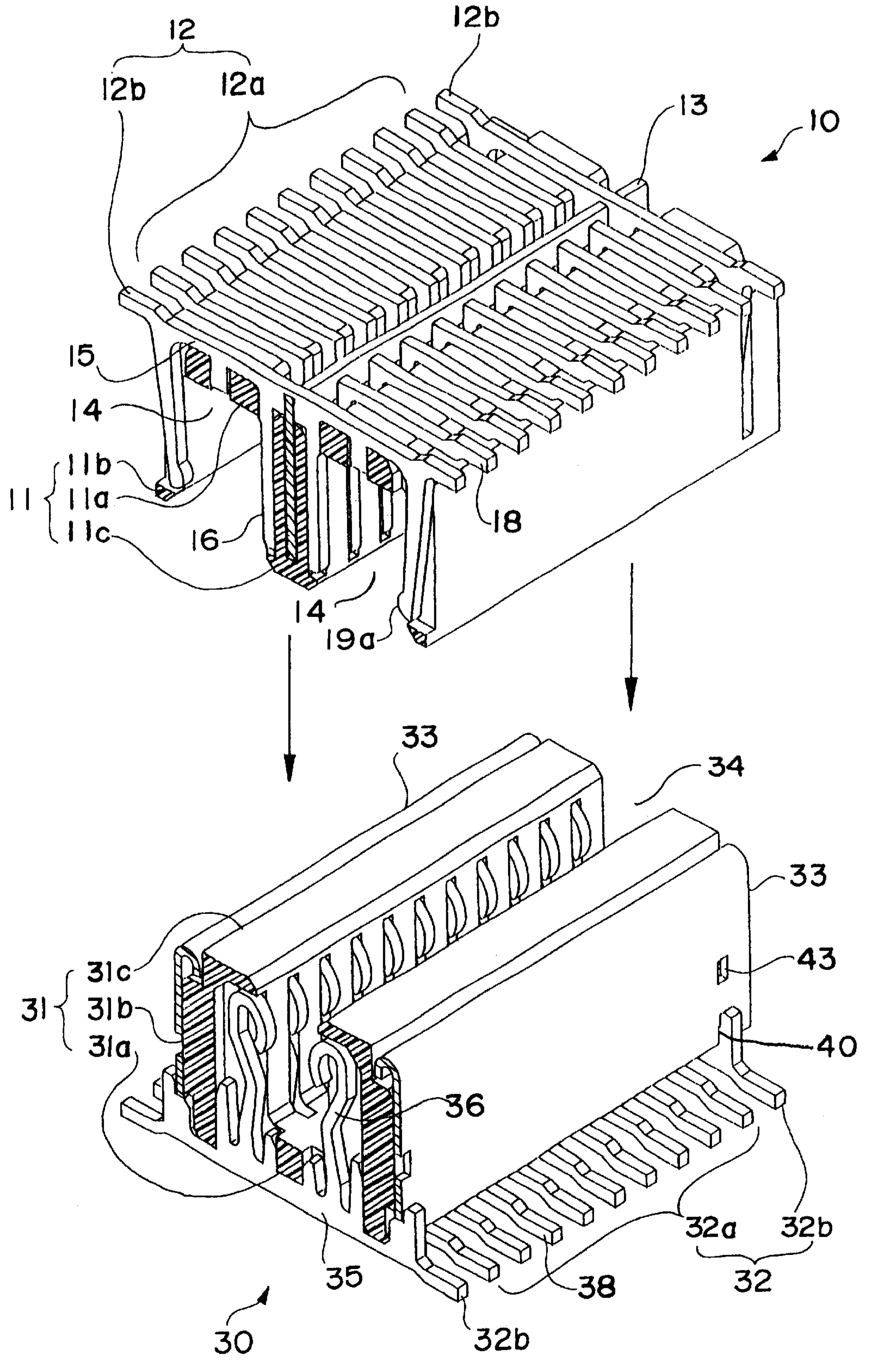
FIG. 2 shows a perspective, enlarged view of the section of the electrical connector assembly, which section is indicated by dimension line "A" in FIG. 1.

As shown in FIG. 1 and FIG. 2 (FIG. 2 is a perspective view of the section A in FIG. 1), an electrical connector assembly 1 according to the present invention comprises a plug connector 10 and a receptacle connector 30. These connector halves 10 and 30 are mated to each other to bring the electrical contacts 12 of the plug connector 10 and the electrical contacts 32 of the receptacle connector 30 into electrical contact for signal transmission. For the sake of convenience in description, the lateral direction of FIG. 1 is defined as "back-and-forth direction", the top-and-bottom direction thereof is defined as "up and down direction", and the direction perpendicular to the drawing thereof is defined as "lateral direction".

As shown in FIG. 2, the plug connector 10 has a plug housing 11 which is formed of an insulative material. This housing includes a horizontal base wall 11*a,* lateral side walls 11*b,* which extend downward from the lateral ends of the base wall 11*a,* and a central protrusion 11*c,* which protrudes downward from the center of the base wall 11*a*. The plug connector 10 further comprises a plurality of plug contacts 12, which are formed of an electrically conductive plate material and are aligned and retained in the plug housing 11, and a central grounding plate 13, which is made of an electrically conductive material and is positioned inside the central protrusion 11*c,* extending in the back-and-forth direction.

As shown in FIG. 2, on the opposite sides of the central protrusion 11*c* of the plug housing 11, two lateral rows of plug contacts 12 are provided, each row extending in the back-and-forth direction. There are two types of plug contacts 12: one for signal transmission and the other for electrical grounding. Each of the plug contacts 12*a* for signal transmission has a "L" shape, and two signal plug contacts 12*a* in a pair face each other on the opposite sides of the central grounding plate 13 in the plug housing 11. Each of the plug contacts 12*b* for grounding has a shape comparable to that in which a pair of signal plug contacts 12*a* are combined into a one piece at the center top of the electrical connector, and each grounding plug contact 12*b* is placed in a position which is comparable to that of a pair of signal plug contacts 12*a*.

In the plug housing 11, the lateral pairs of signal plug contacts 12*a* are positioned in succession in the back-and-forth direction, and the grounding plug contacts 12*b* are positioned to section these pairs of signal plug contacts 12*a* into groups (nine pairs are sectioned into a group in this embodiment).

The receptacle connector 30 has a receptacle housing 31 which is formed of an insulative material. This housing includes a horizontal base wall 31*a* and lateral side walls 31*b,* which extend upward from the lateral ends of the base wall 31*a*. The receptacle connector 30, which is open upward, further comprises a plurality of plug contacts 32, which are formed of an electrically conductive plate material and are aligned and retained in the receptacle housing 31, and two lateral grounding plates 33, which are made of an electrically conductive material and are positioned laterally outside the receptacle housing 31.

As shown in FIG. 2, inside the receptacle housing 31, two lateral rows of receptacle contacts 32 are provided, each row extending in the back-and-forth direction. There are two types of receptacle contacts 32: one for signal transmission and the other for electrical grounding. Each of the receptacle contacts 32*a* for signal transmission generally has a "L" shape with its top end being curled inward. Each of the receptacle contacts 32*b* for grounding has a shape comparable to that in which a pair of signal receptacle contacts 32*a* are combined into a one piece at the center bottom of the electrical connector. The grounding receptacle contacts 32*b* are positioned in a comparable way as the signal receptacle contacts 32*a*.

In the receptacle housing 31, the lateral pairs of signal receptacle contacts 32*a* are positioned in succession in the back-and-forth direction, and the grounding receptacle contacts 32*b* are positioned to section these pairs of signal receptacle contacts 32*a* into groups (nine pairs are sectioned into a group in this embodiment).

As shown in FIG. 1 and FIG. 2, the signal plug contacts 12*a* and the signal receptacle contacts 32*a* are positioned appropriately such that the respective pairs of contacts come into electrical contact when the respective connector halves are mated to each other. Also, the grounding plug contacts 12*b* and the grounding receptacle contacts 32*b* are positioned appropriately such that the respective pairs come into electrical contact when the respective connector halves are mated to each other. Therefore, in the condition where the plug connector 10 and the receptacle connector 30 are in engagement, the signal plug contacts 12*a* are in electrical connection with the corresponding signal receptacle contacts 32*a* (the portions of the electrical connector assembly where the signal contacts are in electrical connection are referred to as "signal connection portions"), and the grounding plug contacts 12*b* are in electrical connection with the grounding receptacle contacts 32*b* (the portions of the electrical connector assembly where the grounding contacts are in electrical connection are referred to as "grounding connection portions").

Figure 3:
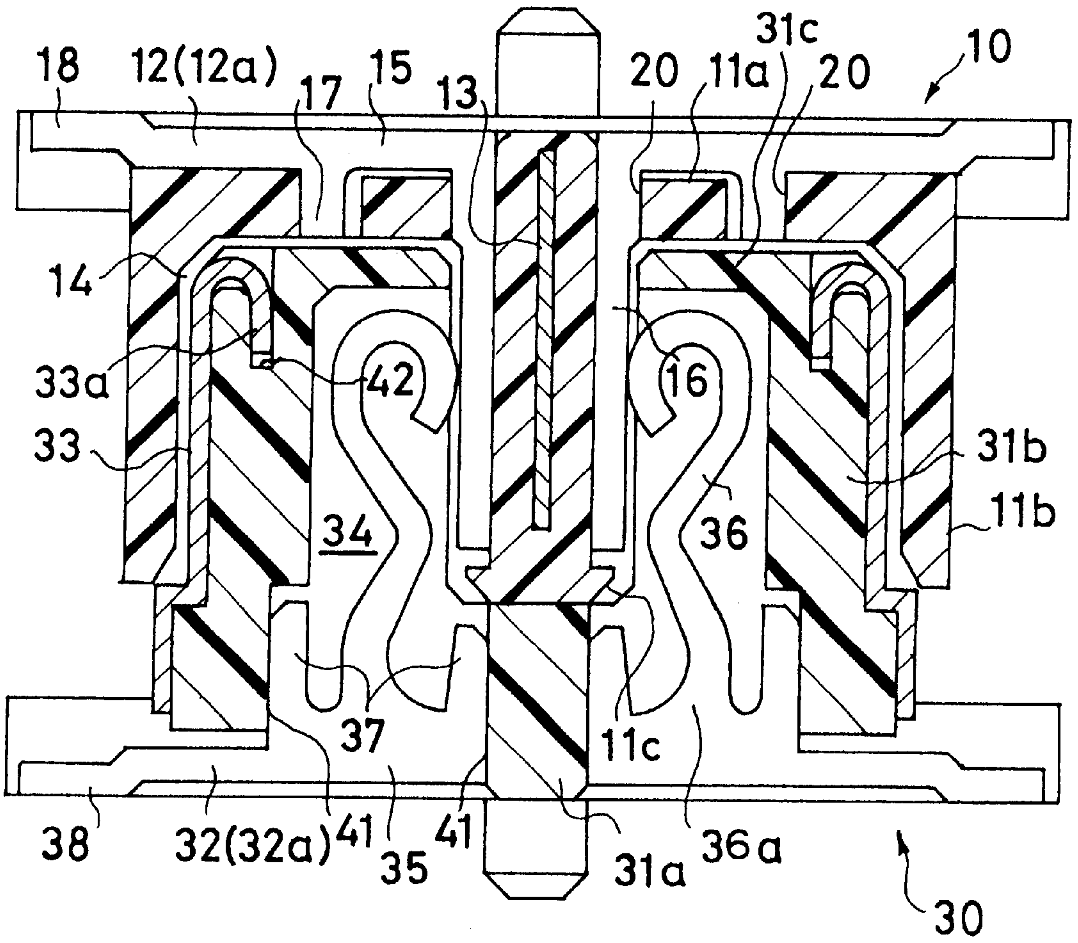
FIG. 3 shows a sectional view of a signal transmission portion of the electrical connector assembly in engagement.
Figure 4:
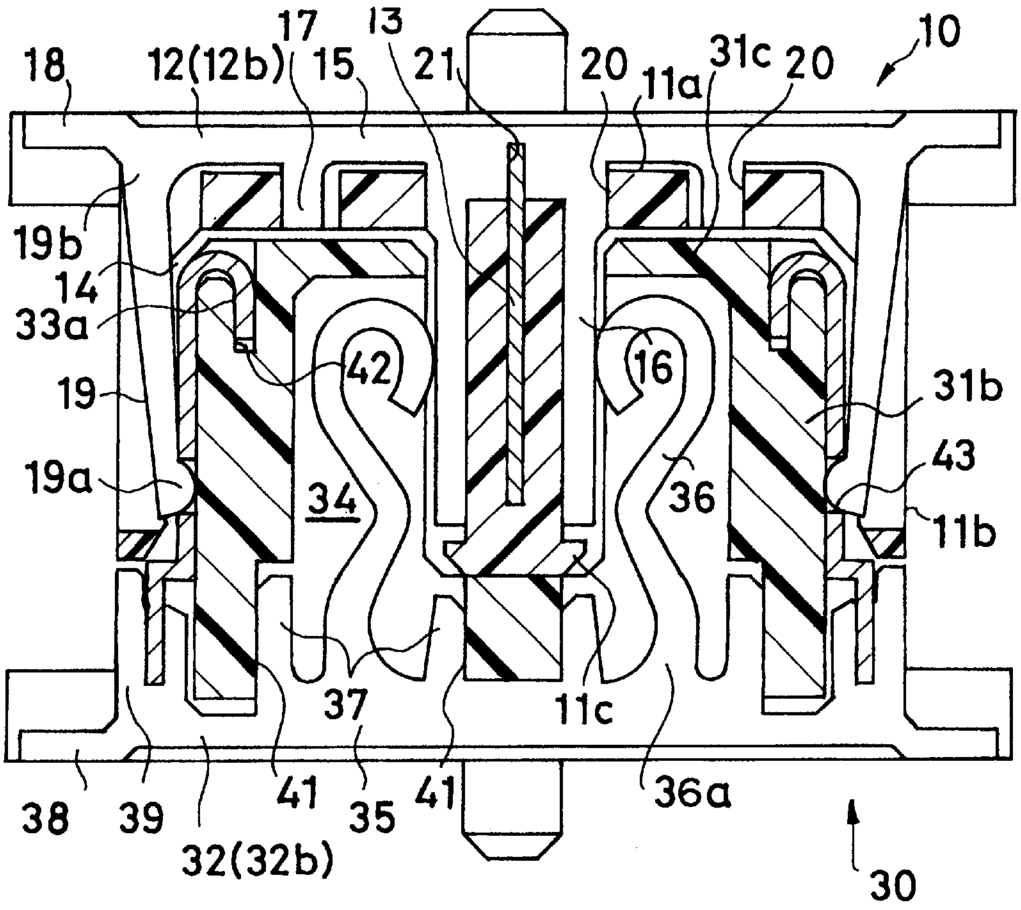
FIG. 4 shows a sectional view of a grounding portion of the electrical connector assembly in engagement.

The plug connector 10 and the receptacle connector 30 are shown in engagement in FIG. 3 and FIG. 4. FIG. 3 is a cross-sectional view taken along line X—X in FIG. 1 (i.e., a view of a signal connection portion) while FIG. 4 is a cross-sectional view taken along line Y—Y in FIG. 1 (i.e., a view of a grounding connection portion). As both the connector halves 10 and 30 are laterally symmetrical, only one sides of the symmetrical portions are marked with numerals.

As shown in FIGS. 2, 3 and 4, the plug housing 11 of the plug connector 10 comprises the base wall 11*a*, which is horizontally positioned, the lateral side walls 11*b*, which extend downward from the lateral ends of the base wall 11*a*, and the central protrusion 11*c*, which protrudes downward from the center of the base wall 11*a*. In this configuration, on the lower face of the base wall 11*a*, plug cavities 14 are defined by the lateral side walls 11*b* and the central protrusion 11*c*, the cavities being open downward.

As shown in FIG. 3, the signal plug contact 12*a* includes a base portion 15, which extends horizontally near the upper part of the plug connector 10, a contact portion 16, which extends downward from the inside end of the base portion 15, a protruding portion 17, which extends downward at the middle part of the base portion 15, and a lead portion 18, which is provided at the outside end of the base portion 15. On the other hand, the grounding plug contacts 12*b* includes the features of a pair of signal plug contacts 12*a* in a shape which is comparable to that of the signal plug contacts 12*a* combined into a one piece at the top of the electrical connector as shown in FIG. 4. Furthermore, the grounding plug contact 12*b* includes a pair of arm portions 19 which extend downward near the lateral outside ends, and each of the arm portions 19 further includes a raised portion 19*a*, which protrudes inward at the lower end thereof. In this configuration, the arm portions 19 are laterally resilient around the supporting portions 19*b* of the arm portions 19.

In the base wall 11*a* and the central protrusion 11*c* of the plug housing 11, fitting slots 20 are provided for attaching the signal plug contacts 12*a* and the grounding plug contacts 12*b* (slots are also provided in the lateral side walls 11*b* where the grounding plug contacts are positioned). During the assembly of the electrical connector, the contact portions 16 and the protruding portions 17 of the respective plug contacts are staked into these fitting slots 20. As a result, a pair of signal plug contacts 12*a* are placed at each of the signal connection portions as shown in FIG. 3 while a grounding plug contacts 12*b* is placed at each of the grounding connection portions as shown in FIG. 4. In this condition, the contact portions 16 of the signal plug contacts 12*a* and grounding plug contacts 12*b* are positioned such that one lateral sides of the contact portions 16 are exposed into the plug cavities 14 while the lead portions 18 of the respective contacts are exposed from the upper face of the plug housing 11. Thus, these plug contacts are aligned in the back-and-forth direction as shown in FIG. 2.

As shown in FIGS. 3 and 4, the central grounding plate 13 is press fit into the central protrusion 11*c* of the plug housing 11 in the back-and-forth direction. This grounding plate 13 is insulated from the lateral signal plug contacts 12*a* at the signal connection portions by the central protrusion 11*c* of the housing while being in contact with the grounding plug contacts 12*b* at the grounding connection portions, with the upper end of the central grounding plate 13 being fit into engaging slots 21 which are provided in the grounding plug contacts 12*b*. Therefore, the central grounding plate 13 is electrically connected only to the grounding plug contacts 12*b*.

The lead portions 18 of the signal plug contacts 12*a* and grounding plug contacts 12*b*, which portions are exposed from the upper surface of the base wall 11*a* of the plug housing 11, are mounted on a surface of a printed circuit board K1 which is provided for the plug connector as shown in FIG. 1. A pair of positioning pins 44 and 45 are provided on the upper face of the plug housing 11 each at the opposite end in the back-and-forth direction, and these positioning pins are inserted into the positioning holes which are provided on the printed circuit board K1 for accurate positioning of the plug connector onto the printed circuit board. After this positioning, the signal plug contacts 12*a* and the grounding plug contacts 12*b* are surface mounted on the printed circuit board by soldering each respective contact to a corresponding electrical pathway of a circuit pattern for signal transmission or for electrical grounding, respectively.

The receptacle housing 31 of the receptacle connector 30 comprises the base wall 31*a*, which is horizontally positioned (the portion illustrated with hatching in FIGS. 3 and 4 is only a central portion of the base wall 31*a*), and the lateral side walls 31*b*, which extend upward from the lateral ends of the base wall 31*a*. The upper end portions 31*c* of the lateral side walls 31*b* extend horizontally inward, so the receptacle cavity 34 is defined by the lateral side walls 31*b* and the upper end portions 31*c*.

As shown in FIG. 3, the signal receptacle contacts 32*a* includes a base portion 35, which extends horizontally, a contact portion 36, which extends upward from the inside end of the base portion 35 and curls inward at its upper end, an anchoring portion 37, which extends upward from the base portion 35 on the opposite sides of the contact portion 36, and a lead portion 38, which is provided at the outside end of the base portion 35. Furthermore, the contact portion 36 is laterally resilient around a supporting portion 36*a* which is the part near the base portion.

On the other hand, the grounding receptacle contact 32*b* includes the features of a pair of signal receptacle contacts 32*a* in a shape which is comparable to that of the signal receptacle contacts 32*a* combined into a one piece at the bottom of the electrical connector as shown in FIG. 4. Furthermore, the grounding receptacle contact 32*b* includes a pair of bifurcated holders 39, which extend upward at the lateral outside ends thereof.

In the base wall 31*a* of the receptacle housing 31, fitting slots 41 are provided in the up and down direction for attaching the signal receptacle contacts 32*a* and the grounding receptacle contacts 32*b*. During the assembly of the electrical connector, the anchoring portions 37 of the respective receptacle contacts are staked into these fitting slots 41. As a result, a pair of signal receptacle contacts 32*a* are placed at each of the signal connection portions as shown in FIG. 3 while a grounding receptacle contact 32*b* is placed at each of the grounding connection portions as shown in FIG. 4. In this condition, the contact portions 36 of the signal receptacle contacts 32*a* and grounding receptacle contacts 32*b* are positioned in the receptacle cavity 34 with a central space between the lateral respective pairs of contact portions 36. While both connector halves 10 and 30 are not mated, this space remains a little narrower than the lateral width of the central protrusion 11*c* of the plug housing 11. The lead portions 38 of the signal receptacle contacts 32*a* and grounding receptacle contacts 32*b* are exposed from the lower face of the base wall 31*a* of the housing. Thus, the lead portions 38 of the respective receptacle contacts are aligned in the back-and-forth direction as shown in FIG. 2.

As shown in FIGS. 2, 3 and 4, the lateral grounding plates 33 are attached on the lateral side walls 31*b* of the receptacle housing 31. Each lateral grounding plate 33 extends in the back-and-forth direction and has a bent portion 33*a*, which is formed by folding the upper end of the grounding plate inwardly. This bent portion 33*a* is press fit into a groove 42 which is provided at the upper end of each lateral side wall 31*b* of the housing, and thereby the lateral grounding plates 33 are mounted on the receptacle housing. In this condition, these lateral grounding plates 33 are insulated from the signal receptacle contacts 32*a* at the signal connection portions by the lateral side walls 31*b* of the housing while being in contact with the grounding receptacle contacts 32*b* at the grounding connection portions, with the lateral grounding plates 33 being fit into the grooves 40 of the holders 39 of the grounding receptacle contacts 32*b* (refer to FIG. 2). It should be noted that the lateral grounding plates 33 are electrically connected only to the grounding receptacle contacts 32*b*. Moreover, dents (or holes) 43 are provided on the outer faces of the lateral grounding plates 33 at the locations where the grounding receptacle contacts 32*b* are positioned in the back-and-forth direction.

The lead portions 38 of the signal receptacle contacts 32*a* and grounding receptacle contacts 32*b*, which portions are exposed from the lower surface of the base wall 31*a* of the receptacle housing 31, are mounted on a surface of a printed circuit board K2 which is provided for the receptacle connector as shown in FIG. 1. A pair of positioning pins 46 and 47 are provided on the lower face of the receptacle housing 31, each at the opposite end in the back-and-forth direction, and these positioning pins are inserted into the positioning holes which are provided on the printed circuit board K2 for accurate positioning of the receptacle connector to the printed circuit board. After this positioning, the signal receptacle contacts 32*a* and the grounding receptacle contacts 32*b* are surface mounted on the printed circuit board by soldering each respective contact to a corresponding electrical pathway of a circuit for signal transmission or for electrical grounding, respectively.

The plug connector 10 and the receptacle connector 30 constructed as described above are engaged by inserting and fitting the protruding portions of the receptacle connector 30, which are covered laterally with the grounding plates 33, into the plug cavities 14 of the plug connector 10, and thereby inserting and fitting the central protrusion 11*c* of the plug connector 10 into the space between the upper end portions 31*c* and then into the receptacle cavity 34 of the receptacle connector 30. While both the connector halves 10 and 30 are being brought into engagement, the contact portions 16 of the plug contacts, which are placed laterally on the opposite sides of the central protrusion 11*c*, meet, open and bend the contact portions 36 of the receptacle contacts, which are standing in the receptacle cavity 34, laterally outward around the supporting portions 36*a* of the contact portions 36, which experience elastic deformation. As a result, the contact portions 36 of the receptacle contacts 32 are retained in contact and electrical connection with the contact portions 16 of the plug contacts 12 with a sufficient contact pressure.

In addition, while the plug connector 10 and the receptacle connector 30 are being mated to each other, the arm portions 19 of the grounding plug contacts 12*b* are opened laterally by the insertion of the bent portions 33*a* of the lateral grounding plates 33 of the receptacle connector. When both the connector halves 10 and 30 are brought into complete engagement, the raised portions 19*a* of the arm portions 19 enter the dents 43 of the lateral grounding plates 33. As a result, both the connector halves 10 and 30 are firmly engaged and retained to each other. A click sound is generated at the insertion of the raised portions 19*a* into the dents 43, so the correct engagement of the connector halves 10 and 30 can be audibly confirmed.

The electrical connector assembly 1, which is used for signal transmission in this engaged condition, has an advantage in the prevention of crosstalk in the connector assembly. More specifically, the possibility of crosstalk which may be observable between the lateral pairs of signal plug contacts 12*a* is very small because of the provision of a strip line, i.e., the central grounding plate 13, which is positioned between the lateral pairs of signal plug contacts 12*a* and positioned between the lateral grounding plates 33, which are electrically grounded through the grounding plug contacts 12*b* and grounding receptacle contacts 32*b* to the electrically grounding pathways provided on the plug connector printed circuit board K1 and the receptacle connector printed circuit board K2. Therefore, the signal transmission characteristic of the electrical connector assembly 1 is superior to conventional electrical connectors. Moreover, electrical noise coming from the outside environment to the electrical connector assembly 1 is absorbed into the lateral grounding plates 33 of the receptacle connector 30, which are electrically grounded through the grounding receptacle contacts 32*b* to the electrically grounding pathway provided on the receptacle connector printed circuit board K2. Therefore, the electrical connector assembly 1 is also immune to outside noise.

As described above, the grounding plug contacts 12*b* and the grounding receptacle contacts 32*b* are provided as parts of the electrical contacts which are placed in the plug housing 11 and the receptacle housing 31, respectively. There is no need of providing such special contacts as used in the prior art, for the connection of the central grounding plate 13 and lateral grounding plates 33 to the grounding pathways provided on the printed circuit boards. Therefore, the electrical connector assembly according to the present invention requires a relatively small number of parts, so it can avoid unfavorable impedance characteristic.

In addition, as described above, the electrical connector assembly according to the present invention comprises a plurality of grounding plug contacts 12*b* and grounding receptacle contacts 32*b,* which are provided to partition the signal plug contacts 12*a* and the signal receptacle contacts 32*a* into groups, respectively. With this construction, the electrical connector assembly enables a plurality of electrically grounding pathways to be provided in the circuits of the respective printed circuit boards, for connection to the central grounding plate 13 and lateral grounding plates 33. Therefore, the grounding lines of the central grounding plate 13 and lateral grounding plates 33 can be relatively short, so improvement can be made in impedance matching, thereby further reducing the possibility of crosstalk.

Furthermore, as an another embodiment according to the present invention, each of the grounding receptacle contacts 32*b* can be designed also in two separate symmetrical parts in a similar way as the signal receptacle contacts 32*a.*

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

RELATED APPLICATIONS

This application claims the priority of Japanese Patent Application No.PH10-123328 filed on May 6, 1998, which is incorporated herein by reference.

What is claimed is:

1. A plug connector comprising:

a plug housing including a plug cavity, which is open in a direction for engagement with a receptacle connector;

a plurality of signal plug contacts being aligned in lateral pairs, i.e., in two rows, in said plug cavity, said rows extending in a back-and-forth direction;

a first grounding plate, which extends between said lateral two rows of signal plug contacts in said back-and-forth direction; and a plurality of grounding plug contacts for partitioning said rows of signal plug contacts, said grounding plug contacts being positioned to extend laterally to said first grounding plate and in contact and electrical connection with said first grounding plate; wherein:

said plug housing comprises lateral side walls, a base wall and a protrusion, said lateral side walls and said base wall defining said plug cavity, said protrusion protruding from said base wall into said plug cavity and extending in said back-and-forth direction along a lateral center of said plug housing;

each of said signal plug contacts and said grounding plug contacts comprises a plug base portion, which extends laterally, and a plug contact portion, which extends from said plug base portion to the opening of said plug cavity;

said signal plug contacts and said grounding plug contacts are mounted in said plug housing with said plug contact portions extending along lateral side faces of said protrusion and said plug base portions extending along said base wall laterally outward;

said first grounding plate is provided inside said protrusion of said plug housing, extending in said back-and-forth direction;

portions of said first grounding plate which are exposed from said protrusion are in contact with central portions of said grounding plug contacts; and plug lead portions which are extensions of said plug base portions of said signal plug contacts and said grounding plug contacts are exposed to outside from said base wall, said plug lead portions being for surface mounting said plug connector onto circuits provided on a plug-side printed circuit board.

2. A receptacle connector comprising:

a receptacle housing including a receptacle cavity, which is open in a direction for engagement with a plug connector;

a plurality of signal receptacle contacts being aligned in lateral pairs, i.e., in two rows, in said receptacle cavity, said rows extending in a back-and-forth direction;

a lateral pair of second grounding plates, which extend in said back-and-forth direction outside said lateral two rows of signal receptacle contacts; and a plurality of grounding receptacle contacts for partitioning said rows of signal receptacle contacts, said grounding receptacle contacts being positioned to extend laterally to said second grounding plates and in contact and electrical connection iwht said second grounding plates, wherein:

said receptacle housing comprises lateral side walls and a base wall, which define said receptacle cavity;

each of said signal receptacle contacts and said grounding receptacle contacts comprises a receptacle base portion, which extends laterally, and a receptacle contact portion, which extends from said receptacle base portion to the opening of said receptacle cavity;

said signal receptacle contacts and said grounding receptacle contacts are mounted in said receptacle housing with said receptacle contact portions extending along inside faces of said lateral side walls and said receptacle base portions extending along said base wall laterally outward;

said second grounding plates are positioned outside said lateral side walls of said receptacle housing, each grounding plate on one lateral side wall; and receptacle lead portions which are extensions of said receptacle base portions of said signals receptacle contacts and said grounding receptacle contacts are exposed to outside from said base wall, said receptacle lead portions being for surface mounting said receptacle connector onto circuits provided on a receptacle-side printed circuit board.

3. The connector set forth in claim 2 wherein each of said grounding receptacle contacts is formed in lateral symmetry in a one-piece body.

4. An electrical connector comprising a plug connector and a receptacle connector, both of which are mated with each other for signal transmission, wherein;

said plug connector comprises:

a plug housing including a plug cavity, which is open in a direction for engagement with a receptacle connector;

a plurality of signal plug contacts being aligned in lateral pairs, i.e., in two rows, in said plug cavity, said rows extending in a back-and-forth direction;

a first grounding plate, which extends between said lateral two rows of signal plug contacts in said back-and-forth direction; and a plurality of grounding plug contacts for partitioning said rows of signal plug contacts, said grounding plug contacts being positioned to extend laterally to said first grounding plate and in contact and electrical connection with said first grounding plate; and said receptacle connector comprises:

a receptacle housing including a receptacle cavity, which is open in a direction for engagement with said plug connector;

a plurality of signal receptacle contacts being aligned in lateral pairs, i.e., in two rows, in said receptacle cavity, said rows extending in back-and-forth direction;

a lateral pair of second grounding plates, which extend in said back-and-forth direction outside said lateral two rows of signal receptacle contacts; and a plurality of grounding receptacle contacts for partitioning said rows of signal receptacle contacts, said grounding receptacle contacts being positioned substantially orthogonally to said second grounding plates and in contact and electrical connection with said second grounding plates; and when said plug connector and said receptacle connector are mated with each other, said signal plug contacts come into contact with said signal receptacle contacts, respectively, and said grouping plug contacts come into contact with said grounding receptacle contacts, respectively, wherein:

each of said grounding plug contacts includes a plug base portion, plug contact portions and arm portions, said arm portions extending in parallel with and in a same direction as said plug contact portions from lateral outside ends of said plug base portion; and when said plug connector and said receptacle connector are mated with each other, said arm portions come into contact with said second grounding plates.

5. The electrical connector set forth in claim 4 wherein:

said arm portions include raised portions, which protrude laterally inward from ends of said arm portions; and when said plug connector and said receptacle connector are brought into engagement with each other, said raised portions come into and engage with dents which are provided on said second grounding plates and generate a clicking sound.

* * * * *